Jan. 5, 1971 V. BEZOUSKA ET AL 3,553,538

PRESSURE CONTACT SEMICONDUCTOR DEVICE

Filed Nov. 12, 1968

United States Patent Office 3,553,538

Patented Jan. 5, 1971

3,553,538

PRESSURE CONTACT SEMICONDUCTOR DEVICE

Vlastimil Bezouska, Pruhonice, and Jan Pivrnec, Jiri Hrdlicka, Evzen Krasa, and Zdenek Smekal, Prague, Czechoslovakia, assignors to CKD Praha, oborovy podnik, Prague, Czechoslovakia Filed Nov. 12, 1968, Ser. No. 776,003
Claims priority, application Czechoslovakia, Nov. 9, 1967, 7,950/67; Dec. 4, 1967, 8,569/67; May 18, 1968, 3,649/68
Int. Cl. H01l 3/00, 5/00
U.S. Cl. 317—234 11 Claims

ABSTRACT OF THE DISCLOSURE

In the semiconductor assemblies, a plate shaped semiconductor element interposed between the contact faces of two electrodes, a first and second frame member fixed to the outer surface of each of the electrodes respectively, the frame members each being provided with circumferential cylindrical members adapted to telescopingly fit, one within the other, to retain the assembly therein.

DESCRIPTION OF THE INVENTION

The present invention relates to a pressure contact semiconductor device. More particularly, the invention relates to a semiconductor device having a planar semiconductor junction body held in pressure contact with its electrodes.

Two types of known arrangement are used for contacting a planar semiconductor body or element with electrodes. In one case, a solid metallic bond is provided between the semiconductor element and the electrodes, usually by soldering. The principal disadvantage of such a bond is that the planar semiconductor element and the electrodes consist of materials having coefficients of thermal expansion which differ from each other. Due to thermal cycles, the soldered bonds often deteriorate, and this may result in destruction of the semiconductor body or element.

From the point of view of function and technology, another well known system of bonding electrodes to planar semiconductor junction elements, the so-called compression bond encapsulation, is presently preferred. This system of bonding provides a sliding contact. The advantage of such a sliding contact is that during thermal expansion, deterioration of the bond is avoided.

Two known types of housing or casing are utilized with this system of bonding. According to one practice, the casing is of orthodox type, comprising a base plate, which also serves as a first electrode. A spring holder is affixed to the base plate. The springs of the spring holder act on the semiconductor junction body or element through a second electrode to press the semiconductor body to the base plate. The assembly is covered by a cap affixed to the base plate and incorporates an outlet of the second electrode. A shortcoming of this type of device is its costly production and the considerable space which it requires. The principal disadvantage is that only one-side cooling of the semiconductor body is possible.

At the present time, the other type of casing is most frequently used. In this casing, the main planar electrodes are joined to each other by an interconnecting member, in conjunction with which the electrodes constitute a casing of simple structure. The casing includes a semiconductor junction body consisting of a single crystal silicon wafer having at least one pn junction and provided with terminal electrodes formed either by direct metal plating of the silicon wafer, or by the securing of stiffening plates thereto. The plates are of a material having a thermal coefficient of expansion which is similar to that of the semiconductor body. The semiconductor body contacts the functional surfaces of both electrodes. The pressure necessary for achieving close contact between the electrodes and the semiconductor body is provided by pressure means located outside the casing. The pressure means usually comprises two heat sinks, which simultaneously provide two-side cooling of the semiconductor body.

In some casings of the aforedescribed type, the interconnecting member comprises two frames, each being a circular ring and each being secured at its inner edge to a corresponding one of the principal electrodes. The frames are provided with metallic extensions on their outer peripheral surfaces or circumferences and are connected to each other, usually by a weld, at such extensions. The metallic extensions have the configuration of flat rings, disposed in a plane perpendicular to the axis of the semiconductor device. The extensions facilitate axial movement of the principal electrodes to provide close engagement of the semiconductor body and the electrodes under pressure.

A disadvantage of the known devices is that they fail to insure parallelism of the planar surfaces of the principal electrodes and the semiconductor body and deviations due to production tolerances are difficult to compensate for. This shortcoming is particularly apparent in conjunction with casings in which the principal electrodes comprise rigid, non-deformable plates. This type of principal electrode however is advantageous, since it facilitates perfect preparation of the contact surfaces from the point of view of planar parallelism and roughness.

The principal object of the present invention is to provide a new and improved pressure contact semiconductor device.

An object of the present invention is to provide a pressure contact semiconductor device which provides planar parallelism between the planar surfaces of the semiconductor body and the electrodes.

An object of the present invention is to provide a pressure contact semiconductor device which is compact and occupies little space.

An object of the present invention is to provide a pressure contact semiconductor device which is inexpensive to produce.

An object of the present invention is to provide a pressure contact semiconductor device which is efficient, effective and reliable in maintaining pressure contact between the semiconductor body and the electrodes.

An object of the present invention is to provide a pressure contact semiconductor device which provides maximum planar parallelism of the contact surfaces.

An object of the present invention is to provide a pressure contact semiconductor device which eliminates the adverse effects on planar parallelism of manufacturing tolerances and pressure forces.

In accordance with the present invention, a semiconductor device comprises a semiconductor body having spaced opposite planar surfaces. A first substantially rigid plate elctrode abuts one planar surface of the semiconductor body and has a peripheral surface. A second substantially rigid plate electrode abuts the other planar surface of the semiconductor body and has a peripheral surface. A first frame member of substantially annular configuration has a substantially cylindrical inner surface affixed to the first electrode at the peripheral surface thereof and a substantially cylindrical outer surface. A second frame member of substantially annular configuration has a substantially cylindrical inner surface affixed to the second electrode at the peripheral surface thereof and a substantially cylindrical outer surface. A first hollow cylindrical member has a cylindrical inner surface affixed to the outer surface of one of the first and second frame members, a cylindrical outer surface and a first diameter and a first altitude. A second hollow cylindrical member is coaxially positioned around and next adjacent the first hollow cylindrical member and has a cylindrical inner surface affixed to the outer surface of the other of the first and second frame members, a cylindrical outer surface and a second diameter and a second altitude. The second diameter of the second hollow cylindrical member is greater than the first diameter of the first hollow cylindrical member and the second altitude of the second hollow cylindrical member is longer than the first altitude of the first hollow cylindrical member. Part of the inner surface of the second hollow cylindrical member abuts the entire outer surface of the first hollow cylindrical member and is affixed thereto.

The inner surface of the first hollow cylindrical member is affixed to the outer surface of the first frame member and the inner surface of the second hollow cylindrical member is affixed to the outer surface of the second frame member.

Each of the first and second hollow cylindrical members may comprise dielectric material or each may comprise metal. The first hollow cylindrical member may comprise dielectric material and may be integrally formed with the first frame member and the second hollow cylindrical member may comprise dielectric material and may be integrally formed with the second frame member. Each of the first and second frame members may comprise dielectric material. One of the first and second frame members may comprise dielectric material and the other of the first and second frame members may comprise metal. Each of the first and second frame members comprises a substantially frustoconical section.

Each of the first and second hollow cylindrical members may comprise metal and the cylindrical members may be affixed to each other by solder or by a weld. The cylindrical members may be affixed to each other by a substantially annular clamping member. Each of the cylindrical members may have a substantially circular extending portion at its corresponding free end extending outward from the inner surface of the first cylindrical member and extending outward from the outer surface of the second cylindrical member to form a lip. The substantially annular clamping member clamps the cylindrical members to each other at the lip. The clamping member comprises plastic material and is of substantially U-shaped cross-sectional configuration.

In accordance with the present invention, the semiconductor device casing or housing includes an interconnecting member for the principal electrodes which are non-deformable plates. The interconnecting member comprises two annular frame members having outer edges provided with metal extensions. This type of connection of the frame members insures maximum planar parallelism of the contact surfaces of the semiconductor body. The semiconductor body comprises a single crystal silicon wafer having at least one pn junction and terminal electrodes formed by direct metal plating of the silicon wafer or by securing stiffening plates thereto. The plates comprise a material having a thermal coefficient of expansion which is similar to that of silicon and the principal electrodes thereby retaining the pressure force required to insure full contact at its minimum.

In accordance with the invention, the extensions of the aforedescribed casing are two tubes or hollow cylindrical members of different diameter and different altitude. Each of the tubes is secured at its inner cylindrical surface to the outer cylindrical surface of a corresponding one of the frame members. The cylindrical members are coaxial with the axis of the semiconductor device and are positioned one in the other. The altitudes of the cylindrical members are different, so that one of said members extends beyond the base of the other and beyond the frame member to which the cylindrical member of shorter altitude is affixed. The cylindrical members have corresponding base ends and an annular clamping member clamps said cylindrical members together at their corresponding ends.

Prior to the joining together of the first and second cylindrical members, there is a maximum planar parallelism of the contact surfaces. After the assembly of the device is completed and the casing is closed, the casing is a rigid ring, which insures the maintenance of the planar parallelism. Thus, without any difficulty in production and without the need for special operations, adverse effects of manufacturing tolerances on the planar parallelism and, consequently, on the pressure forces are avoided.

In one embodiment of the invention the first and second hollow cylindrical members are metal and are affixed to each other by a weld.

In another embodiment of the invention, the first and second hollow cylindrical members are dielectric material integrally formed with their corresponding frame members and said cylindrical members are affixed to each other by a clamping member. Each of the cylindrical members has a substantially circular extending portion at its corresponding free end to form a lip. The substantially annular clamping member clamps the cylindrical members to each other at the lip. The clamping member comprises plastic material of substantially U-shaped cross-sectional configuration. In a modification of this embodiment of the invention, the abutting surfaces of the hollow cylindrical members are metal-plated and said cylindrical members are affixed to each other by solder or by a solder layer.

In still another embodiment of the invention, one of the frame members comprises dielectric material and the other of said frame members comprises metal. The metal frame member is integrally formed with the corresponding hollow cylindrical member, which is metal.

In order that the present invention may be readily carried into effect, it will now be described with reference to the accompanying drawing, wherein.

In the figures, the same components are identified by the same reference numerals.

In each of the figures a semiconductor body 1 is shown having spaced opposite planar surfaces **1*a* and 1*b*. The semiconductor body 1 comprises a single crystal silicon wafer having at least one pn junction positioned between two principal electrodes 2 and 3, made of a rigid copper plate or similar conductive material. The electrode 2 functions as an anode and the electrode 3** functions as a cathode.

The first plate electrode 2 abuts the upper planar surface **1*a* of the semiconductor body 1 and has a peripheral or circumferential surface. The second plate electrode 3 abuts the lower planar surface 1*b* of the semiconductor body 1** and also has a peripheral or circumferential surface.

Figure 1:
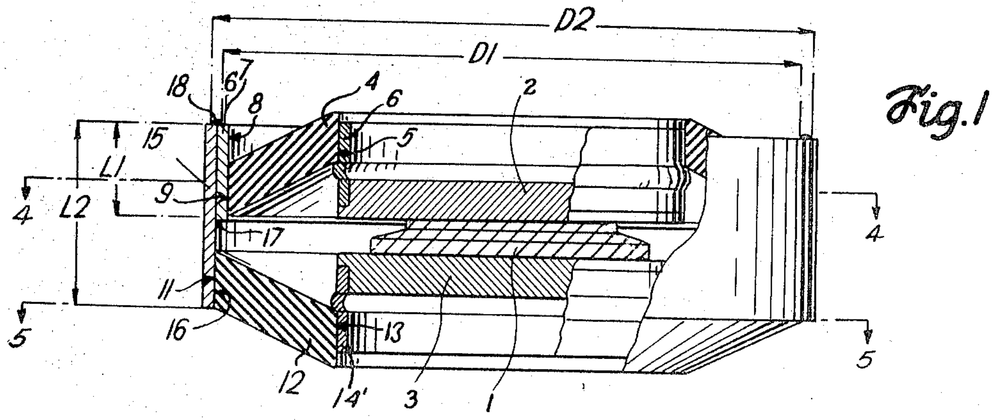
FIG. 1 is a sectional view of an embodiment of the semiconductor device of the present invention.

In the embodiment of FIG. 1, a first frame member 4, of dielectric material of substantially annular configuration, more specifically a frustoconical section, has a substantially cylindrical inner surface 5. The inner surface 5 of the first frame member 4 is affixed to the first electrode or anode 2 at the peripheral surface of said electrode via a first connecting member 6 of hollow substantially cylindrical configuration. The dielectric material is preferably a ceramic. The first connecting member 6 comprises an iron-nickel alloy.

A first hollow cylindrical member 7 comprising an iron-nickel alloy has a cylindrical inner surface 8 affixed to the outer surface 9 of the first frame member 4. The first cylindrical member 7 has a cylindrical outer surface 11, a first diameter D1, which is its average or mean diameter, and a first altitude L1.

A second frame member 12, of dielectric material of substantially annular configuration, more specifically a frustoconical section, has a substantially cylindrical inner surface 13. The inner surface 13 of the second frame member 12 is affixed to the second electrode or cathode 3 at the peripheral surface of said electrode via a second connecting member 14 of hollow substantially cylindrical configuration. The second connecting member 14 comprises an iron-nickel alloy.

A second hollow cylindrical member 15 comprising an iron-nickel alloy is coaxially positioned around and next adjacent the first cylindrical member 7. The second cylindrical member 15 has a cylindrical inner surface 16 affixed to the outer surface 11 of the first cylindrical member 7. The second cylindrical member 15 has a second diameter D2, which is its average or mean diameter, and a second altitude L2.

The second diameter D2 of the second cylindrical member 15 is greater than the first diameter D1 of the first cylindrical member 7 and the second altitude L2 of said second cylindrical member is longer than the first altitude L1 of said first cylindrical member. As seen in FIG. 1, approximately the upper half of the inner surface 16 of the second cylindrical member 15 abuts the entire outer surface 11 of the first cylindrical member 7 and is affixed thereto. The first and second cylindrical members 7 and 15 are affixed to each other by any suitable means such as, for example, a weld 17 and/or a weld 18, or solder, or a solder layer between said cylindrical members.

Figure 2:
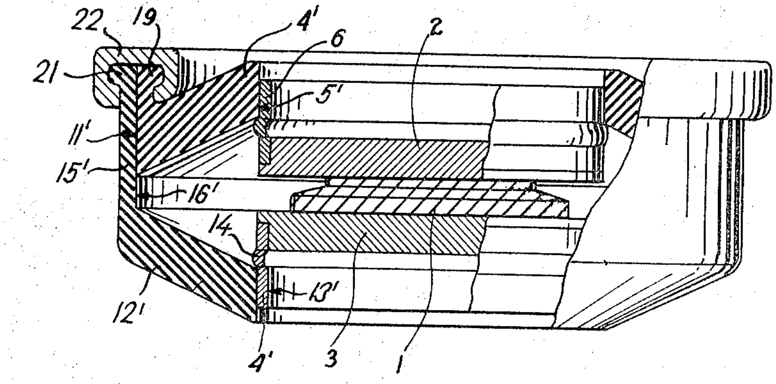
FIG. 2 is a sectional view of another embodiment of the semiconductor device of the present invention.

In the embodiment of FIG. 2 the first hollow cylindrical member 7′ is formed of dielectric material, integral with and extending from the upper surface of the first frame member 4′. The second hollow cylindrical member 15′ is also formed of dielectric material integral with and also extending from the upper surface of the second frame member 12′. The first cylindrical member 7′ has a substantially circular extending lip portion 19 at its free end extending transversely outward from its inner surface. The second cylindrical member 15′ has a substantially circular extending lip portion 21 at its free end extending outwardly from its outer surface in a direction latterly oppositely to the direction of the lip portion 19.

In FIG. 2, a substantially annular clamping member 22 clamps the first and second cylindrical members 7′ and 15′ to each other about the lip portions 19, 21. The clamping member 22 may comprise plastic material or ceramic material and is of substantially U-shaped cross-sectional configuration. The first and second cylindrical members 7′ and 15′ may be finally joined or sealed by plastic, which may be provided by injection molding of plastic material. The abutting surfaces 11′ and 16′ of the first and second cylindrical members 7′ and 15′ may be metal plated. In such case, said cylindrical members are affixed to each other by solder.

Figure 3:
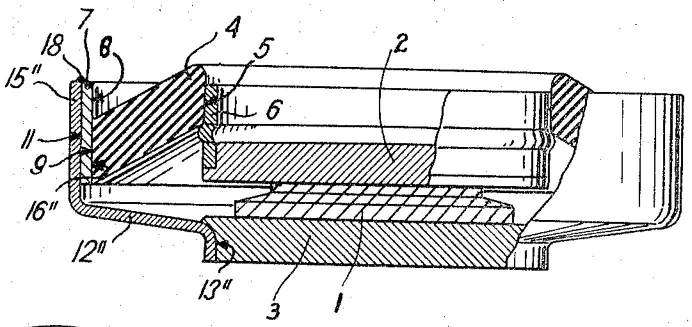
FIG. 3 is a sectional view of still another embodiment of the semiconductor device of the present invention.
Figure 4:
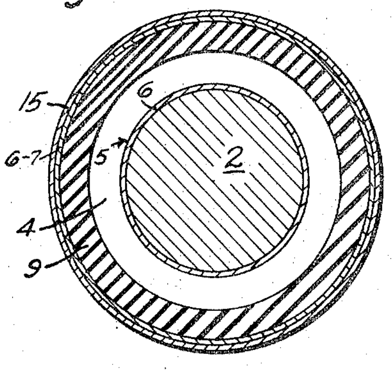
FIG. 4 is a sectional view taken along line 4—4 of FIG. 1.
Figure 5:
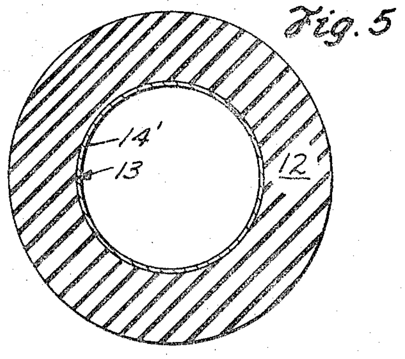
FIG. 5 is a sectional view taken along line 5—5 of FIG. 1.

In the embodiment of FIG. 3, as shown in FIG. 3, the first frame member 4, of dielectric material is of the same configuration as the first frame member 4 of the embodiment of FIG. 1 and the first frame member 4′ of the embodiment of FIG. 2. The inner surface 5 of the first frame member 4 is affixed to the first electrode 2 at the peripheral surface of said electrode via the first connecting member 6 of hollow substantially cylindrical configuration, as in the embodiment of FIG. 1.

The first hollow cylindrical member 7 is the same as that of FIG. 1 and has a cylindrical inner surface 8 affixed to the outer surface 9 of the first frame member 4.

The second frame member 12″ of the embodiment of FIG. 3, comprises metal of substantially annular configuration, more specifically a frustoconical section of iron-nickel alloy, and has a substantially cylindrical inner surface 13″. The inner surface 13″ of the second frame member 12″ is affixed to the second electrode 3 at the peripheral surface of said electrode.

The second hollow cylindrical member 15″ comprises an iron-nickel alloy and is integrally formed with the second frame member 12″. The second cylindrical member 15″ is coaxially positioned around and next adjacent the first cylindrical member 7. The second cylindrical member 15″ has a cylindrical inner surface 16″ affixed to the outer surface 11 of the first cylindrical member 7.

As shown in each of FIGS. 2 and 3, most of the inner surface 16′ of the second cylindrical member 15′ abuts the entire outer surface 11′ of the first cylindrical member 7′ and is affixed thereto (FIG. 2) and most of the inner surface 16″ of the second cylindrical member 15″ abuts the entire outer surface 11 of the first cylindrical member 7 and is affixed thereto (FIG. 3). The first and second cylindrical members 7 and 15″ of FIG. 3 are affixed to each other by any suitable means such as, for example, a weld 18, or solder, or a solder layer between the cylindrical members.

The semiconductor casing or device of FIG. 1, and those of FIGS. 2 and 3, except for the last steps, may be manufactured by first preparing a first subassembly of the first electrode 2, the first connecting member 6, the first frame member 4 and the first hollow cylindrical member 7 and a second subassembly of the second electrode 3, the second connecting member 14, the second frame member 12 and the second hollow cylindrical member 15.

The semiconductor body 1 is then placed on the second electrode 3 of the second subassembly, and the first subassembly is positioned with the first hollow cylindrical member 7 coaxially inside and next adjacent the second hollow cylindrical member 15 of said second subassembly. A suitable tool is then utilized to apply a minimum predetermined pressure to urge the first and second subassemblies to each other via the first and second electrodes 2 and 3. The planar abutting surfaces or contact surfaces of the first and second electrodes 2 and 3 and of the semiconductor body 1 are brought into contact with each other. This eliminates any possible adverse effect, due to manufacturing tolerances, on the electrical contact between the semiconductor body 1 and the electrodes 2 and 3. The first and second hollow cylindrical members 7 and 15 are then affixed to each other.

While the invention has been described by means of specific examples and in specific embodiments, we do not wish to be limited thereto, for obvious modifications will occur to those skilled in the art without departing from the spirit and scope of the invention.

What we claim is:

1. A semiconductor device comprising
- a semiconductor body having first and second spaced opposite planar surfaces;
- a first substantially rigid plate electrode abutting said first planar surface of said semiconductor body, said first electrode having a peripheral surface;
- a second substantially rigid plate electrode abutting said second planar surface of said semiconductor body; said second electrode having a peripheral surface;
- a first frame member of substantially annular configuration having a substantially cylindrical inner connecting member affixed to the first electrode at the peripheral surface thereof said first frame member having a substantially cylindrical outer surface;
- a second frame member of substantially annular configuration having a substantially cylindrical inner connecting member affixed to the second electrode at the peripheral surface thereof said second frame member having a substantially cylindrical outer surface;

a first hollow cylindrical member having a cylindrical inner surface affixed to the outer surface of one of said first and second frame members and having a cylindrical outer surface and a first diameter and a first altitude; and a second hollow cylindrical member coaxially positioned around and next adjacent said first hollow cylindrical member and having a cylindrical inner surface affixed to the outer surface of said second frame member and having a cylindrical outer surface and a second diameter and a second altitude, the second diameter of said second hollow cylindrical member being greater than the first diameter of said first hollow cylindrical member and the second altitude of said second hollow cylindrical member being longer than the first altitude of said first hollow cylindrical member, part of the inner surface of said second hollow cylindrical member abutting the entire outer surface of said first hollow cylindrical member and being affixed thereto.

2. A semiconductor device as claimed in claim 1, wherein each of said first and second hollow cylindrical members comprises metal.

3. A semiconductor device as claimed in claim 1, wherein each of said first and second hollow cylindrical members comprises dielectric material.

4. A semiconductor device as claimed in claim 1, wherein said first hollow cylindrical member comprises dielectric material and is integrally formed with said first frame member and said second hollow cylindrical member comprises dielectric material and is integrally formed with said second frame member.

5. A semiconductor device as claimed in claim 1, wherein one of said first and second frame members comprises dielectric material and the other of said first and second frame members comprises metal.

6. A semiconductor device as claimed in claim 1, wherein each of said first and second frame members comprises a substantially conical section.

7. A semiconductor device as claimed in claim 1, wherein each of said first and second hollow cylindrical members comprises metal and includes means for affixing said cylindrical members to each other.

8. A semiconductor device as claimed in claim 4, further comprising a substantially annular clamping member affixing said cylindrical members to each other.

9. A semiconductor device as claimed in claim 4, wherein each of said cylindrical members has a substantially circular extending portion at its corresponding free end etxending outward from the inner surface of said first cylindrical member and extending outward from the outer surface of said second cylindrical member to form a lip, and further comprising a substantially annular clamping member clamping said cylindrical members to each other at said lip.

10. A semiconductor device as claimed in claim 9, wherein said clamping member comprises plastic material.

11. A semiconductor device as claimed in claim 9, wherein said clamping member is of substantially U-shaped cross-sectional configuration.

References Cited

UNITED STATES PATENTS

| | | | |
|---|---|---|---|
| 3,313,987 | 4/1967 | Boyer | 317—234 |
| 3,443,168 | 5/1969 | Camp et al. | 317—234 |
| 3,435,304 | 3/1969 | Bezouska et al. | 317—234 |

JAMES D. KALLAM, Primary Examiner

A. J. JAMES, Assistant Examiner

U.S. Cl. X.R.

317—235